(12) United States Patent
Nakamura et al.

(10) Patent No.: US 8,405,463 B2
(45) Date of Patent: *Mar. 26, 2013

(54) ELECTRONIC DEVICE, ELECTRONIC APPARATUS, AND ELECTRONIC DEVICE MANUFACTURING METHOD

(75) Inventors: Takahiko Nakamura, Chiba (JP); Keiji Sato, Chiba (JP); Hitoshi Takeuchi, Chiba (JP); Kiyoshi Aratake, Chiba (JP); Masashi Numata, Chiba (JP)

(73) Assignee: Seiko Instruments Inc., Chiba (JP)

(*) Notice: Subject to any disclaimer, the term of this patent is extended or adjusted under 35 U.S.C. 154(b) by 0 days.

This patent is subject to a terminal disclaimer.

(21) Appl. No.: 13/115,698

(22) Filed: May 25, 2011

(65) Prior Publication Data

US 2012/0044025 A1 Feb. 23, 2012

(30) Foreign Application Priority Data

Aug. 23, 2010 (JP) ................. 2010-186312

(51) Int. Cl.
*H05K 7/02* (2006.01)
*H03B 5/32* (2006.01)

(52) U.S. Cl. ........... 331/68; 310/348; 174/541; 331/158

(58) Field of Classification Search ............ 331/68, 331/158, 116 R, 108 C, 108 D; 310/348, 310/340; 174/541, 557; 257/E23.059, E23.009, 257/704, 737; 361/820; 29/592.1, 832, 840, 29/842, 852
See application file for complete search history.

(56) References Cited

U.S. PATENT DOCUMENTS

| | | | |
|---|---|---|---|
| 7,211,899 B2* | 5/2007 | Taniguchi | 257/774 |
| 7,221,048 B2* | 5/2007 | Daeche et al. | 257/690 |
| 7,923,904 B2* | 4/2011 | Takeuchi et al. | 310/340 |
| 2010/0053918 A1* | 3/2010 | Nakamura et al. | 361/760 |
| 2010/0326721 A1* | 12/2010 | Nakamura et al. | 174/549 |
| 2011/0193646 A1* | 8/2011 | Sugama et al. | 331/158 |

FOREIGN PATENT DOCUMENTS

JP 11-302034 A 11/1999
JP 2003-209198 A 7/2003

* cited by examiner

*Primary Examiner* — Joseph Chang
(74) *Attorney, Agent, or Firm* — Brinks Hofer Gilson & Lione

(57) ABSTRACT

An electronic device is provided which includes a base, a through-electrode that passes through the base and from which an insulating material on an end face thereof is removed by polishing, a circuit pattern that is formed on an end face of the through-electrode, an electronic component that is disposed via an internal wiring formed on the circuit pattern, an electrode pattern that is formed on the surface of the base opposite to the surface on which the electronic component is disposed and that is connected to the other end face of the through-electrode, an external electrode that is formed on the electrode pattern, and a cap that is bonded to the base so as to protect the electronic component on the base.

19 Claims, 8 Drawing Sheets

ELECTRONIC DEVICE, ELECTRONIC APPARATUS, AND ELECTRONIC DEVICE MANUFACTURING METHOD

RELATED APPLICATIONS

This application claims priority under 35 U.S.C. §119 to Japanese Patent Application No. 2010-186312 filed on Aug. 23, 2010, the entire content of which is hereby incorporated by reference.

BACKGROUND OF THE INVENTION

1. Field of the Invention

The present invention relates to an electronic device such as a crystal oscillator chip or a piezoelectric device and a manufacturing method thereof.

2. Description of the Related Art

Since a crystal oscillator has an excellent frequency characteristic, the crystal oscillator is widely used as a component to be mounted on a printed circuit board. However, in order to stabilize the characteristics of the crystal oscillator, the crystal oscillator is preferably received in a hermetic container to block the influence of external air. "GLASS-CERAMIC COMPOSITE AND FLAT PACKAGE TYPE PIEZOELECTRIC COMPONENT USING THE SAME" (JP-A-11-302034) is proposed as an example of such a package structure.

This package is characterized by that a package is constituted using a mixture of ceramics and glass powder, which have almost the same thermal expansion coefficient as a quartz crystal chip, in an electronic device in which the quartz crystal chip is placed on a base and the resultant is covered with a cap.

However, since this package is formed of a glass-ceramic composite, the package is manufactured by individual production of placing a quartz crystal chip on a base and covering the resultant with a cap and thus the productivity thereof is very low. In addition, it is difficult to process the glass-ceramic composite and thus the production cost thereof is high.

To solve this defect, a method of manufacturing a package out of glass which can be easily processed is proposed and an "electronic component package" or the like is proposed (JP-A-2003-209198).

The above-mentioned example will be described below with reference to FIGS. 12A to 12F. The example provides a method of manufacturing an electronic device 100 through the use of steps of (a) forming a through-hole in a base 110, (b) causing low-melting-point glass to flow into the through-hole and thrusting a metallic pin 120 thereinto, (c) processing a glass plate into a concave state while thrusting the metallic pin 120, (d) forming an electrode 130 by printing, (e) mounting a component such as a crystal oscillator on the metallic pin, (f) sealing and bonding a cap 160 and the base 110 with an encapsulant 150. In the step of (c), the metallic pin 120 closely fixed to the base 110 can be obtained by setting the heating temperature to the softening temperature of glass (about 1000° C.) or higher to weld the glass and thus the air-tightness can be maintained in the step of (f), thereby manufacturing the electronic device at a low cost.

In the step of (c) of the method of manufacturing the electronic device 100, there is a problem shown in FIGS. 13C-1 to 13C-3. FIGS. 13C-1 to 13C-3 are partially-enlarged sectional views illustrating the metallic pin in the step of (c). That is, as shown in FIG. 13C-1, when the metallic pin 120 is short or the thrust distance is small, the metallic pin 120 is covered with the low-melting-point glass 170. Accordingly, the electrical connection between the electrode 130 formed in the step of (d) and the metallic pin 120 is not guaranteed. As shown in FIG. 13C-2, even when the metallic pin 120 is thrust as designed, the glass may cover the tip of the metallic pin 120 due to the base 110 being exposed to a temperature of the softening point or higher. As shown in FIG. 13C-3, there is a problem in that the metallic pin 120 is exposed to the temperature of about 1000° C., an oxide film 180 grows around the metallic pin 120, and the electrode 130 is not electrically connected to the electronic component 140.

SUMMARY OF THE INVENTION

To solve the above-mentioned problems, the invention provides the following means.

According to an aspect of the invention, there is provided an electronic device including: a base formed of glass; a through-electrode that passes through the base; a circuit pattern that is formed on an end face of the through-electrode facing a surface of the base and on the surface of the base; an electrode pattern that is formed on the other end face of the through-electrode facing the opposite surface of the base and on the opposite surface of the base; an internal wiring that is electrically connected to the through-electrode and that covers the circuit pattern; a connection portion that is electrically connected to the internal wiring and that is formed on the internal wiring; an electronic component that is disposed in a cavity section, that is electrically connected to the connection portion, and that is disposed on the connection portion; and an external electrode that is electrically connected to the through-electrode and that is formed on the electrode pattern.

According to this configuration, it is possible to manufacture an electronic device which can guarantee the electrical connection between the through-electrode and the external electrode, which can stably maintain the electrical connection between the electronic component and the external electrode, and which can prevent a variation in wiring resistance and an increase in wiring resistance. Low-melting-point glass may be disposed between the base and the through-electrode.

The circuit pattern may be formed of the same material as the electrode pattern. In this case, aluminum having a low resistance value can be used.

The internal wiring may be formed of the same material as the external electrode. In this case, the internal wiring and the external electrode may be formed of a metal film including a diffusion barrier layer preventing diffusion of metal and a surface layer which is formed on the diffusion barrier layer and of which the outermost surface is formed of gold. According to this configuration, by covering the external electrode with a metal film having a small ionization tendency, the external electrode can be more stably formed and the electrical connection between the electronic component and the external electrode can be guaranteed. By forming a nickel layer, it is possible to prevent the diffusion of aluminum or gold, thereby providing a stable product.

The circuit pattern and the electrode pattern may have a concave portion formed in the surface thereof.

Each of the internal wiring and the external electrode may be formed of a single layer.

According to this configuration, since thin portions of the circuit pattern and the electrode pattern resulting from a level difference formed by the polishing can be covered with the internal wiring and the external electrode, it is possible to guarantee the electrical connection between the electronic component and the external electrode.

The electronic device may further include a cap that is bonded to the surface of the base and that forms a cavity section isolated from external air along with the base. The cap may be formed of one of aluminum, glass, and silicon.

The electronic component may be a crystal oscillator chip.

According to another aspect of the invention, there is provided an electronic apparatus including the above-mentioned electronic device.

According to still another aspect of the invention, there is provided an electronic device manufacturing method including: a step of forming a through-hole in a base; a through-electrode forming step of inserting and welding a through-electrode into the through-hole; a step of polishing end faces of the through-electrode; a circuit pattern forming step of forming a circuit pattern on the end face of the through-electrode facing a surface of the base and on the surface of the base; an electrode pattern forming step of forming an electrode pattern on the end face of the through-electrode facing the opposite surface of the base and on the opposite surface of the base; an internal wiring forming step of forming an internal wiring on the circuit pattern and electrically connecting the internal wiring to the through-electrode; an external electrode forming step of forming an external electrode on the electrode pattern and electrically connecting the external electrode to the through-electrode; and an electronic component connecting step of electrically connecting an electronic component to the internal wiring.

The internal wiring forming step and the external electrode forming step may be carried out as the same step using the same method.

The circuit pattern forming step and the electrode pattern forming step may be carried out as the same step using the same method.

According to still another aspect of the invention, there is provided an electronic device manufacturing method including: a step of forming a through-hole in a base; a through-electrode forming step of inserting and welding a through-electrode into the through-hole; a step of polishing end faces of the through-electrode; a circuit pattern forming step of forming a circuit pattern on the end face of the through-electrode facing a surface of the base and on the surface of the base; an internal wiring forming step of forming an internal wiring on the circuit pattern and electrically connecting the internal wiring to the through-electrode; an electronic component connecting step of electrically connecting an electronic component to the internal wiring; an electrode pattern forming step of forming an electrode pattern on the end face of the through-electrode facing the opposite surface of the base and on the opposite surface of the base; and an external electrode forming step of forming an external electrode on the electrode pattern and electrically connecting the external electrode to the through-electrode.

At least one of the internal wiring and the external electrode may be formed by the use of an electroless plating method in the internal wiring forming step and the external electrode forming step. According to this configuration, since a mask is not necessary, it is possible to manufacture an electronic device at a low cost.

The electronic device manufacturing method may further include a cap bonding step of bonding a cap to the surface of the base to form a cavity section isolated from external air between the base and the cap and providing the electronic component to the cavity section, after the electronic component connecting step.

The electronic device manufacturing method may further include a step of dividing a plurality of electronic devices into individual electronic devices after forming the plurality of electronic devices on the single base in a bundle. According to this configuration, it is possible to manufacture electronic devices according to an aspect of the invention in a bundle, thereby reducing the manufacturing time, the number of process steps, and the cost in the mass production of the electronic devices.

According to the above-mentioned aspects of the invention, it is possible to manufacture an electronic device which can guarantee the electrical connection between the through-electrode and the external electrode, which can stably maintain the electrical connection between the electronic component and the external electrode, and which can prevent a variation in wiring resistance due to an increase in wiring resistance.

DETAILED DESCRIPTION OF PREFERRED EMBODIMENTS

Figure 1:
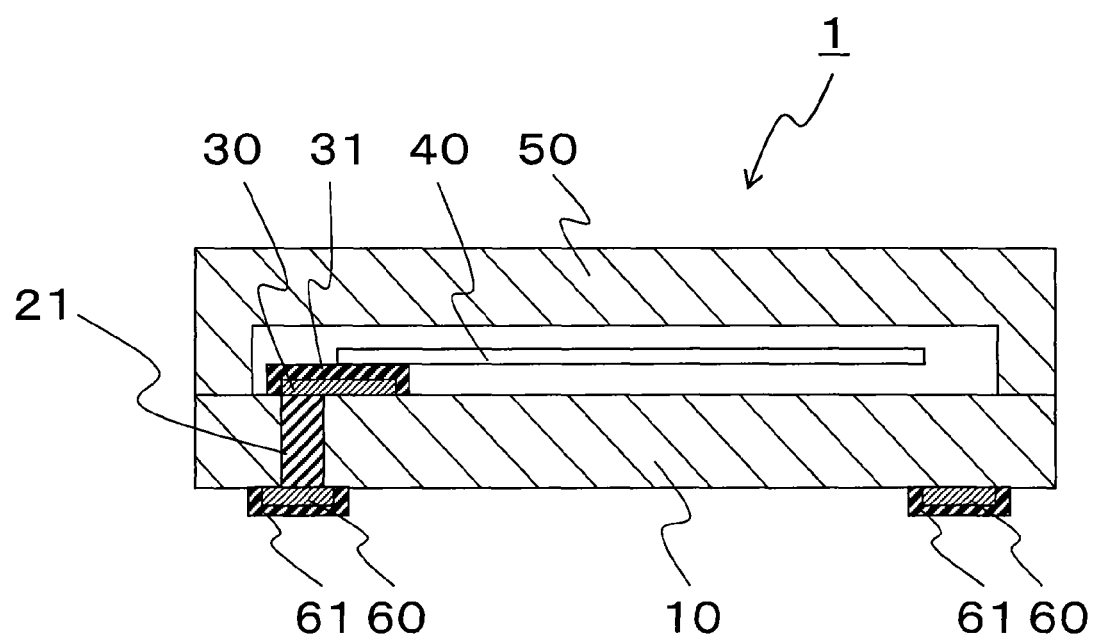
FIG. 1 is a sectional view illustrating an electronic device according to an embodiment of the invention.

Hereinafter, an embodiment of the invention will be described in detail with reference to the accompanying drawings. FIG. 1 is a sectional view illustrating an electronic device according to an embodiment of the invention. In the electronic device 1, an electronic component 40 is mounted into a cavity section isolated from external air and surrounded with a base 10 and a cap 50 formed of glass. The electronic component 40 is electrically connected to an external electrode 61, which is a terminal mounted on a substrate, via an internal wiring 31, a circuit pattern 30, a through-electrode 21, and an electrode pattern 60. The cap 50 is not limited to glass, but may be formed of, for example, silicon, which can be used for an MEMS device such as a pressure sensor. The cap 50 may be formed of aluminum.

The electronic device 1 shown in FIG. 1 is a crystal oscillator in which a tuning-fork crystal oscillator chip is mounted as the electronic component 40. In the embodiment of the invention, the electronic device is not limited to the crystal oscillator, but examples thereof include electronic devices, which can be mounted on the base 10, such as an AT-cut crystal oscillator, a semiconductor circuit, an LED, and various sensors. When the LED or the like is mounted as the electronic component, the electronic device 1 may not include the cap.

The through-electrode 21 is preferably formed of iron-nickel alloy, Kovar alloy, or iron-nickel-chrome alloy. Here, examples of the iron-nickel alloy include 36% Ni—Fe alloy, 42% Ni—Fe alloy, 45% Ni—Fe alloy, 47% Ni—Fe alloy, 50% Ni—Fe alloy, and 52% Ni—Fe alloy. An example of the iron-nickel-chrome alloy is 42% Ni—6Cr—Fe. Since these are materials of which the thermal expansion coefficient is close to that of the base, the product stability is improved. However, other metals may be used and, for example, metals of which the thermal expansion coefficient is close to that of the base 10 and which can prevent the destruction due to the thermal history can be used.

The circuit pattern 30 is formed on an end face of the through-electrode 21 facing a surface of the base 10, that is, a surface opposed to the cavity section, to prevent the oxidation of the through-electrode 21 and on the surface of the base 10. The electrode pattern 60 is formed on the other end face of the through-electrode 21 facing the opposite surface of the base 10 and on the opposite surface of the base 10. A sputtering method is generally used to form the circuit pattern 30 and the electrode pattern 60 and metal such as aluminum having a low resistance value is used.

The internal wiring 31 and the external electrode 61 are formed of a metal film which includes a surface layer of which the outermost surface is formed of precious metal such as gold, silver, and platinum. Since the precious metal has a small ionization tendency and has corrosion resistance, it is possible to suppress the long-term deterioration and thus to improve the reliability of the electronic device according to the embodiment of the invention. The internal wiring 31 and the external electrode 61 are formed of a single layer.

A metal layer of nickel or the like may be formed as a diffusion barrier layer preventing the diffusion of metal under the surface layer formed of the precious metal. The internal wiring 31 and the external electrode 61 can be formed of the same material but may be formed of different materials.

A sputtering method is generally used to form the internal wiring 31 and the external electrode 61. A plating method can be used to form the metal films of the internal wiring 31 and the external electrode 61. At this time, an electroless plating method can be used to form the internal wiring 31 and the external electrode 61. Since the metal film can be formed on only the circuit pattern 30 or on only the electrode pattern 60 by the use of the plating method, the processing of the top surface of the circuit board in the typical plating method can be made to be unnecessary. Accordingly, the electroless plating method less wastes the manufacturing steps and can reduce the cost, compared with the sputtering method and the deposition method. The metal films may be formed by the same method, but may be formed by different methods.

A connection portion (not shown) connecting the internal wiring 31 formed on the circuit pattern 30 to the electronic component 40 can employ a conductive adhesive such as silver paste. In this case, the internal wiring 31 and the electronic component 40 are bonded to each other by baking the conductive adhesive such as silver paste as the connection portion. However, in some configurations of the electronic component 40, the conductive adhesive may not be used as the connection portion. For example, when the outermost surface of the internal wiring 31 is formed of gold, a gold bump (not shown) formed on the electronic component 40 can be used as the connection portion. In this case, a gold-gold bonding method of bonding the gold bump formed on the electronic component 40 to the gold film of the internal wiring 31 by a thermo-compression bonding method can be used instead of the conductive adhesive.

When the base 10 is fragile, the external electrode 61 may be formed of a conductive adhesive such as silver paste reducing the stress due to the mounting on the board.

An electronic device manufacturing method will be described below with reference to FIGS. 2A to 10. FIGS. 2A to 10 show a method of manufacturing an electronic device which is manufactured at a wafer level and which is finally obtained by dicing or the like. The invention is not limited to this method, but may be manufactured as an individual package from the first time.

FIGS. 2A to 2H are diagrams illustrating the process steps of manufacturing the electronic device according to the embodiment of the invention.

Figure 2A:
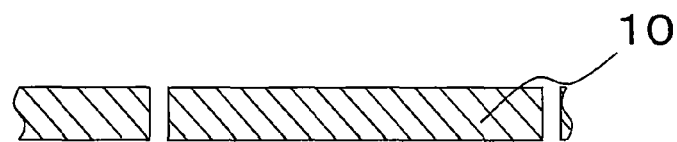
FIGS. 2A to 2H are diagrams illustrating process steps of manufacturing the electronic device according to the embodiment of the invention.

FIG. 2A shows a step of forming a through hole in the base 10. The through-hole is formed by a sand blast method, a laser processing method, a drill processing method, a thermal pressing process, or the like.

Figure 2B:
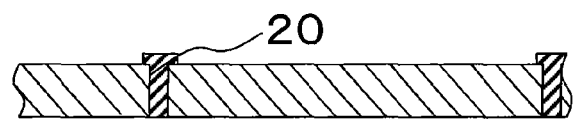

FIG. 2B shows a step of applying low-melting-point glass not shown in the through-hole and inserting and welding the through-electrode 20 into the through-hole.

Figure 2C:
Figure 2D:
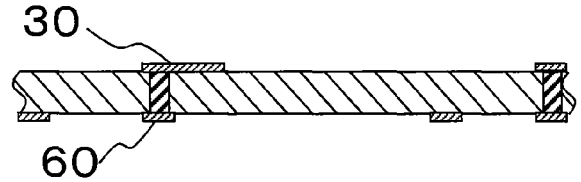
Figure 2E:
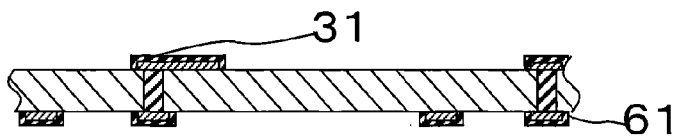
Figure 2F:
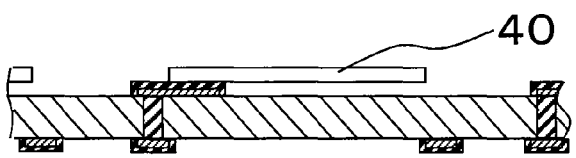
Figure 2G:
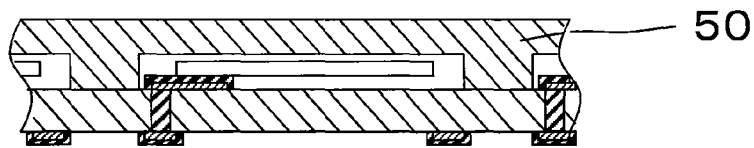
Figure 2H:
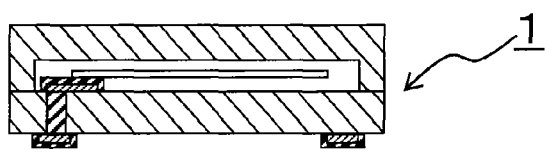
Figure 3:
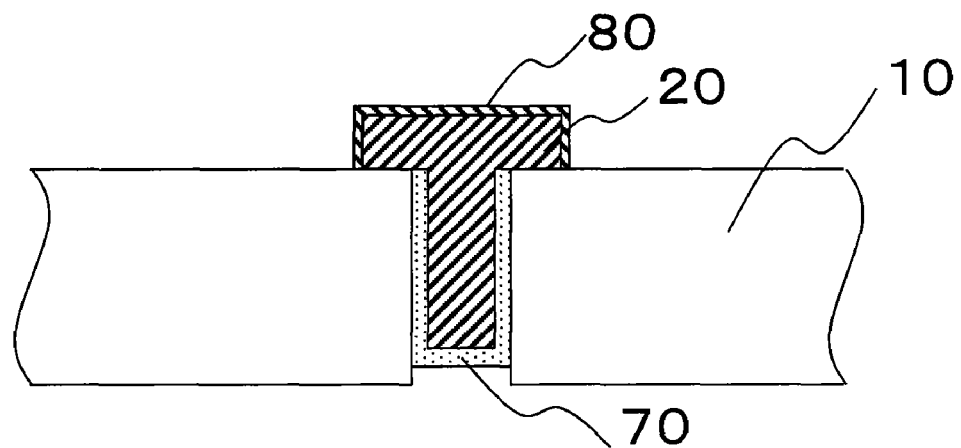
FIG. 3 is a partially-enlarged sectional view of a through-electrode of the electronic device according to the embodiment of the invention.
Figure 4:
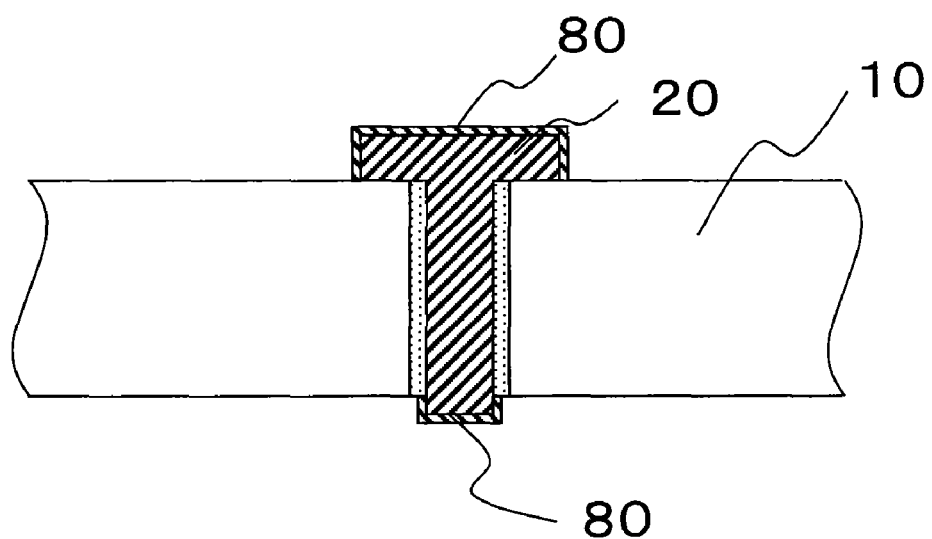
FIG. 4 is a partially-enlarged sectional view of a through-electrode of the electronic device according to the embodiment of the invention.

FIGS. 3 and 4 are partially-enlarged views of the through-electrode 20 shown in FIG. 2B. The through-electrode 20 has a T shape so as not to go out of the hole. The through-hole 20 can employ a metallic pin having a T-shaped section including a large-diameter portion and a small-diameter portion. In FIG. 2(*b*), it is necessary to set the temperature to 400° C. to 500° C. as a temperature range in which the low-melting-point glass is melted so as to weld the glass. When the low-melting-point glass is not used, it is necessary to set the temperature to be equal to or higher than the glass softening temperature (about 1000° C.) of the base 10. Accordingly, in the places not covered with the base 10 and the low-melting-point glass 70, an oxide film 80 may be generated in a portion from which the through-electrode 20 is exposed, as shown in FIGS. 3 and 4, thereby disabling the electrical connection. In this case, it is necessary to remove the oxide film 80.

A step of forming a cut through-electrode 21 is performed by removing the head part of the T shape of the through-electrode 20 and the oxide film 80 and the low-melting-point glass 70 covering the T shape shown in FIGS. 3 and 4.

Figure 5:
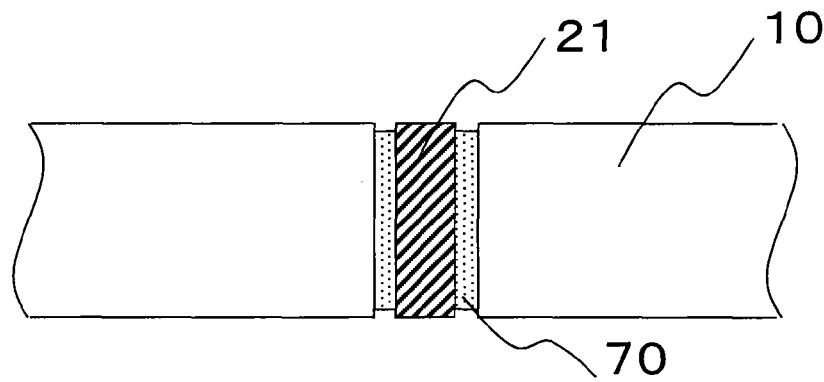
FIG. 5 is a partially-enlarged sectional view of a through-electrode of the electronic device according to the embodiment of the invention.
Figure 8:
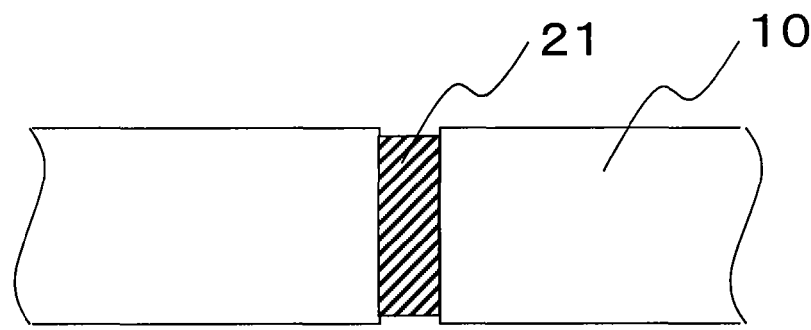
FIG. 8 is a partially-enlarged sectional view of a through-electrode of the electronic device according to the embodiment of the invention.

FIG. 5 is a partially-enlarged view of the through-electrode 20 shown in FIG. 2C. FIG. 5 shows a step of polishing the through-electrode 21 and the base 10 to be thin. By this step, the oxide film 80 and the low-melting-point glass 70 covering the through-electrode 21 are removed and the electrical connection between both surfaces of the base 10 is formed through the through-electrode 21. Since the base 10, the through-electrode 21, and the low-melting-point glass 70 are simultaneously polished, the low-melting-point glass 70 which is the softest material is polished more than the base 10 and thus a level difference is caused therebetween as shown in FIG. 5. When the low-melting-point glass 70 is not used, the configuration shown in FIG. 8 is obtained. In this case, since the through-electrode 20 is softer than the base 10, the through-electrode 21 is polished more than the base 10 and a level difference may be caused therebetween as shown in FIG. 8. That is, a concave portion is formed one surface and the opposite surface of the base by the through-electrode 21 and the base 10.

Figure 6:
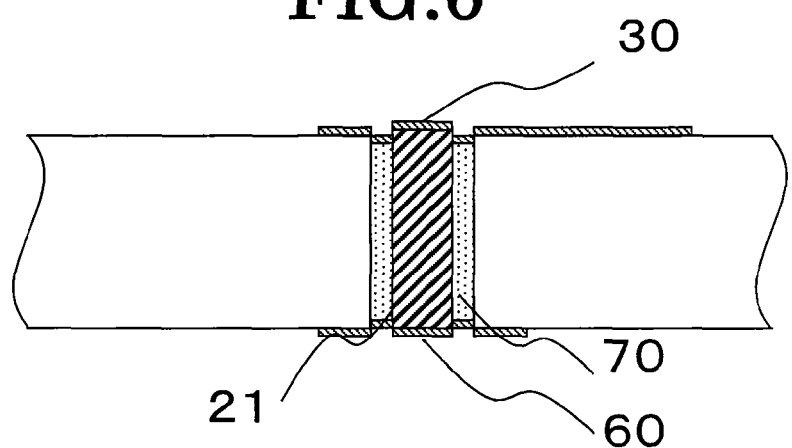
FIG. 6 is a partially-enlarged sectional view of a through-electrode of the electronic device according to the embodiment of the invention.
Figure 9:
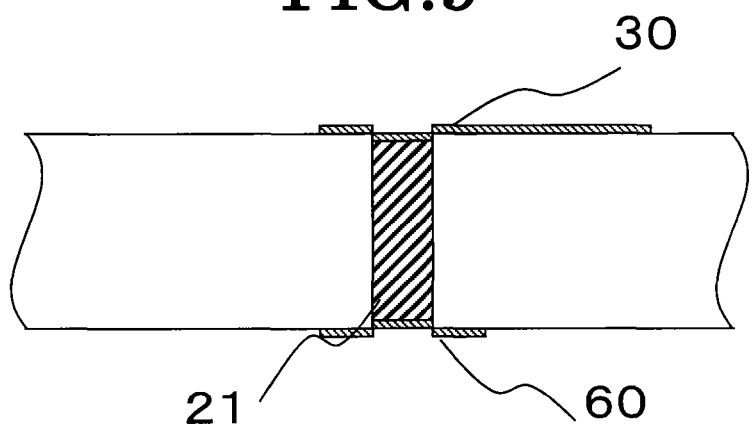
FIG. 9 is a partially-enlarged sectional view of a through-electrode of the electronic device according to the embodiment of the invention.

FIG. 2D shows a step of forming the circuit pattern 30 on an end face of the through-electrode 21 facing one surface of the base 10 and on the surface of the base 10 by the use of a sputtering method and forming the electrode pattern 60 on an end face of the through-electrode 21 opposite to the end face facing the surface of the base 10 and on the opposite surface of the base 10 by the use of a sputtering method. FIG. 6 is a partially-enlarged view of the through-electrode 21 shown in FIG. 2D. Since the base 10, the through-electrode 20, and the low-melting-point glass 70 are simultaneously polished, the low-melting-point glass 70 which is the softest material is polished more than the base 10 and thus a level difference is caused therebetween. Accordingly, a concave portion is formed on the surfaces of the circuit pattern 30 and the electrode pattern 60. Since the circuit pattern 30 and the electrode pattern 60 are formed in this state, the electric resistance increases at the positions where the circuit pattern 30 and the electrode pattern 60 are very thin. In this case, it is necessary to cover the influence of the formed level difference. When the low-melting-point glass 70 is not used, the configuration shown in FIG. 9 is obtained. As shown in FIG. 9, when the circuit pattern 30 and the electrode pattern 60 are formed in the state where the base 10 and the through-electrode 20 have a level difference, the electrical resistance increases at the positions where the circuit pattern 30 and the electrode pattern 60 are very thin. That is, a concave portion is formed on the surfaces of the circuit pattern and the electrode pattern.

Therefore, as shown in FIG. 2E, a step of forming the internal wiring 31 and the external electrode 61 on the circuit pattern 30 and the electrode pattern 60, respectively, and electrically connecting them to the through-electrode is performed. From FIG. 2D to FIG. 2E, a natural oxide film may be formed, but can be removed well by cleaning the resultant with a chemical before the plating. A mask required for forming a film using a sputtering method is not necessary by using the electroless plating method and the internal wiring 31 and the external electrode 61 can be formed at a time. Accordingly, a batch process can be carried out and thus the decrease in cost and the mass productivity are more excellent than other methods. When each of the internal wiring and the external electrode is formed of a single layer, the circuit pattern formed on the through-electrode and the circuit pattern formed on the base may not be connected to each other.

Figure 7:
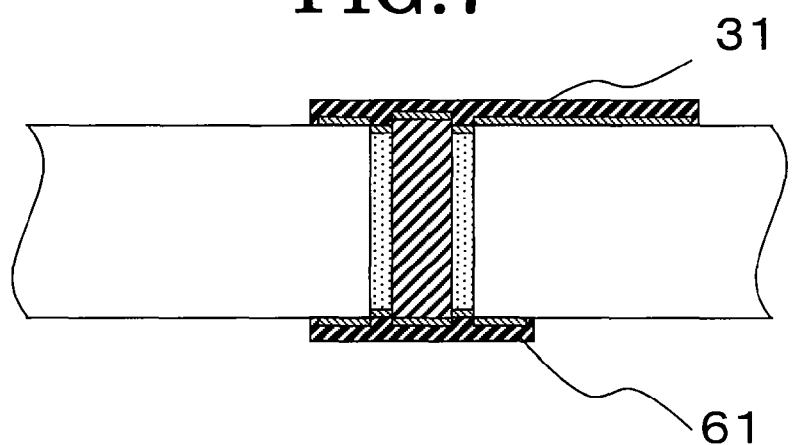
FIG. 7 is a partially-enlarged sectional view of a through-electrode of the electronic device according to the embodiment of the invention.
Figure 10:
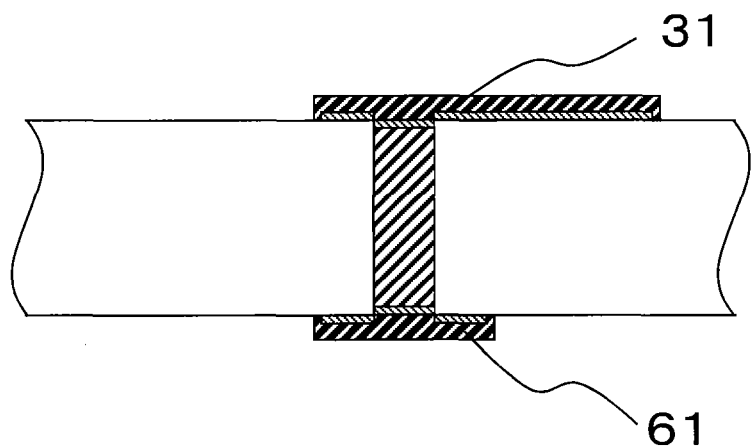
FIG. 10 is a partially-enlarged sectional view of a through-electrode of the electronic device according to the embodiment of the invention.

FIG. 7 is a partially-enlarged view of the through-electrode 20 shown in FIG. 2E. As shown in FIGS. 7 and 2E, the influence of the level difference shown in FIG. 6 can be covered at this time, thereby stably maintaining the electrical connection. Accordingly, each of the internal wiring 31 and the external electrode 61 is formed of a single layer. Since the influence of the level difference can be preferably covered, the metal films of the internal wiring 31 and the external electrode 61 do not have to be formed at a time. Since the metal films can preferably maintain the electrical connection, the metal films can be formed to cover at least the circuit pattern 30 and the electrode pattern 60. When the low-melting-point glass 70 is not used, the configuration shown in FIG. 10 is obtained.

At least one of the internal wiring 31 and the external electrode 61 may be formed by baking metal micro-particles. In this method, the metal micro-particles are dispersed in a solution so as to enable the application using an ink jet apparatus. In this case, the metal micro-particles can be applied to only the circuit pattern 30 or the electrode pattern 60 by mapping the positions of the circuit pattern 30 or the electrode pattern 60 in advance, and the internal wiring 31 and the external electrode 61 can be formed by baking the applied metal micro-particles. The natural oxide film formed from FIG. 2D to FIG. 2E is removed by cleaning the resultant with a chemical before the application. By baking the metal micro-particles to form the metal films, the mask is made to be unnecessary and thus it is possible to manufacture the electronic device at a low cost in comparison with the sputtering method.

The internal wiring 31 and the external electrode 61 may be formed by combination of a sputtering method, a deposition method, and a photolithography method. The internal wiring 31 and the external electrode 61 may be formed in the same process step using the same method. The internal wiring 31 and the external electrode 61 may be formed in different process steps using different methods. For example, when one of the internal wiring 31 and the external electrode 61 is formed by applying and baking the metal micro-particles and the other is formed using another method, both are formed in different process steps.

FIG. 2F shows an electronic component connecting step of disposing the electronic component 40 and connecting the electronic component 40 to the internal wiring 31. The electronic component 40 is disposed on the base with the circuit pattern 30 and the internal wiring 31 interposed therebetween. A connection portion (not shown) connecting the internal wiring 31 to the electronic component 40 can employ a conductive adhesive such as silver paste. In this case, the internal wiring 31 and the electronic component 40 are bonded to each other by baking the conductive adhesive such as silver paste as the connection portion. However, in some configurations of the electronic component 40, the conductive adhesive may not be used as the connection portion. For example, when the outermost surface of the internal wiring 31 is formed of gold, a gold bump (not shown) formed on the electronic component 40 can be used as the connection portion. In this case, a gold-gold bonding method of bonding the gold bump formed on the electronic component 40 to the gold film of the internal wiring 31 by a thermo-compression bonding method can be used instead of the conductive adhesive.

FIG. 2G shows a cap bonding step of bonding the cap 50 which is processed in a concave shape to the base 10 so as to protect the electronic component 40 mounted on the base 10. In this step, a cavity section is formed by one surface of the base 10 and the cap 50. Accordingly, the electronic component is disposed in the cavity section. The cap 50 can be formed of silicon, glass, aluminum, or the like and the material can be selected in consideration of the specifications such as a bonding method, a degree of vacuum, and a cost required for the electronic component 40. For example, when the electronic component 40 is a crystal oscillator chip and the frequency is adjusted after bonding the cap 50 to the base 10, a glass member can be preferably selected as the cap 50. Examples of the bonding method include a bonding method, an anodic bonding method, and a gold-gold bonding method. When the base 10 is processed in a concave shape, it is not necessary to form the cap 50 to be concave. In this case, the shape of the cap is not particular limited, as long as the cavity section is formed and the electronic component is disposed in the cavity section.

FIG. 2H shows a step of dividing the package into individual parts. That is, plural electronic devices are formed on a single base 10 in a bundle and then the resultant is divided into individual electronic devices. In this step, the method of dividing the resultant into individual devices can be changed depending on the material of the cap 50, but can be carried out by the use of dicing or laser cut.

A second method of manufacturing the electronic device according to the embodiment of the invention will be described below with reference to FIGS. 11A to 11I. The same steps as shown in FIGS. 2A to 2H will not be described and only different points from FIGS. 2A to 2H will be described. FIGS. 11A to 11I are diagrams illustrating process steps of manufacturing the electronic device according to the embodiment of the invention.

FIGS. 11A, 11B, 11C, 11F, and 11G are the same as FIGS. 2A, 2B, 2C, 2F, and 2G and thus the description thereof will not be repeated.

Figure 11A:
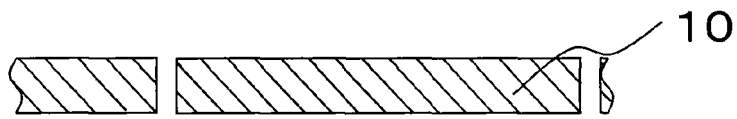
FIGS. 11A to 11I are diagrams illustrating other process steps of manufacturing the electronic device according to the embodiment of the invention.
Figure 11B:
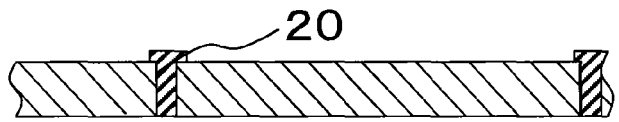
Figure 11C:
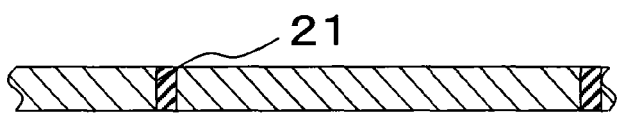
Figure 11D:
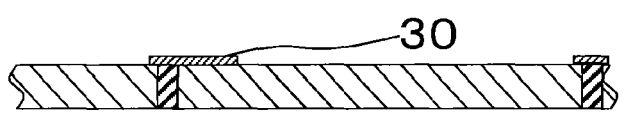

FIG. 11D shows a step of forming only the circuit pattern 30 on an end face of the through-electrode 21 facing one surface of the base 10 and on the surface of the base 10.

Figure 11E:
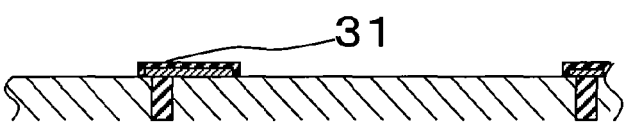
Figure 11F:
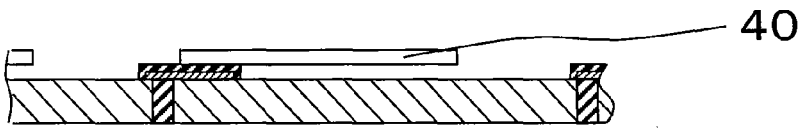
Figure 11G:
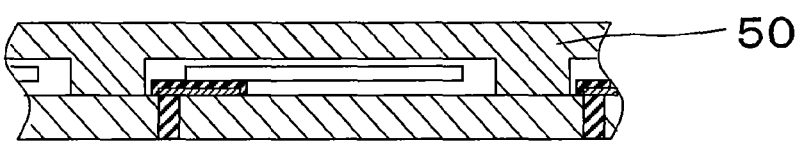

FIG. 11E shows a step of forming the internal wiring 31 on the circuit pattern 30. Only the internal wiring 31 can be formed by using a substitutional electroless plating method.

Figure 11H:
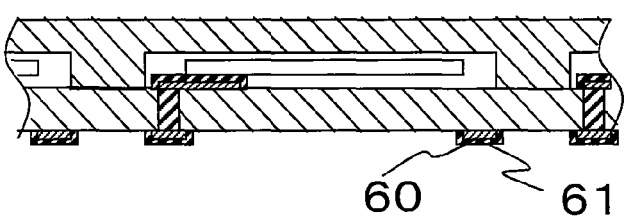

FIG. 11H shows a step of forming the electrode pattern 60 and the external electrode 61. The electrode pattern 60 is formed on the end face of the through-electrode 21 facing the opposite surface of the base 10 and on the opposite surface of the base 10 by the use of a sputtering method. The external electrode 61 is formed on the electrode pattern 60 by the use of an electroless plating method. The external electrode 61 may be formed by printing and baking a conductive adhesive. Otherwise, a metal film may be formed on a conductive adhesive by the use of a sputtering method.

Figure 11I:
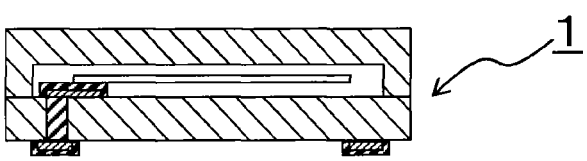
Figure 12A:
FIGS. 12A to 12F are diagrams illustrating process steps in a known example.
Figure 12B:
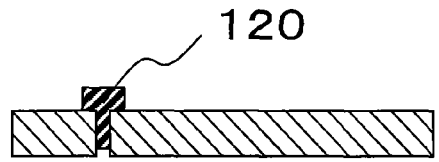
Figure 12C:
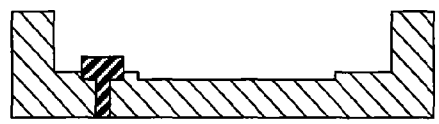
Figure 12D:
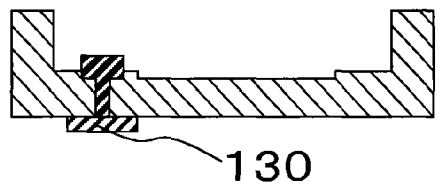
Figure 12E:
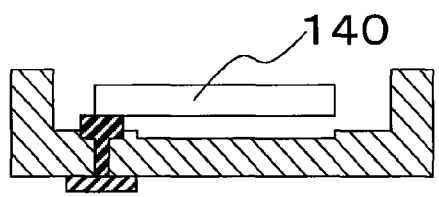
Figure 12F:
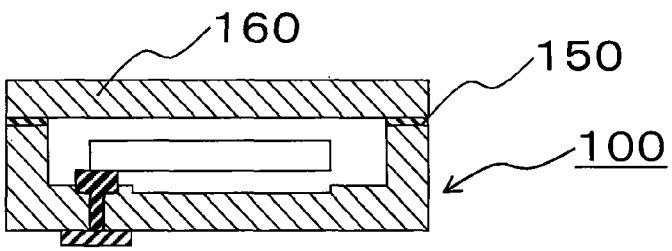
Figure 13A:
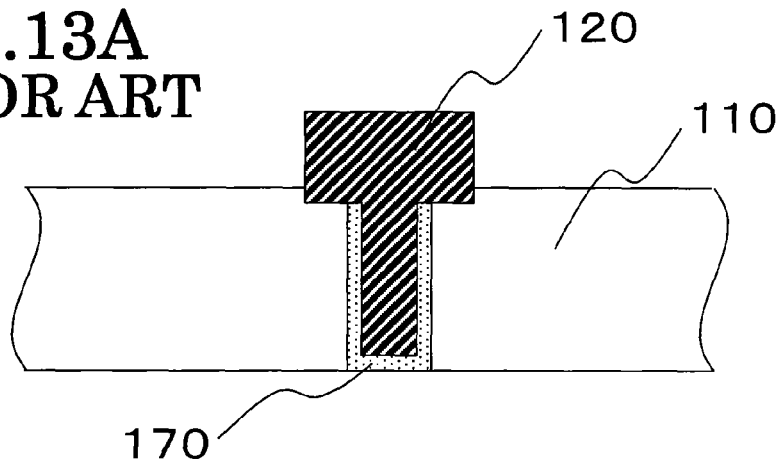
FIGS. 13A to 13C are partially-enlarged sectional views illustrating a metallic pin in the known example.
Figure 13B:
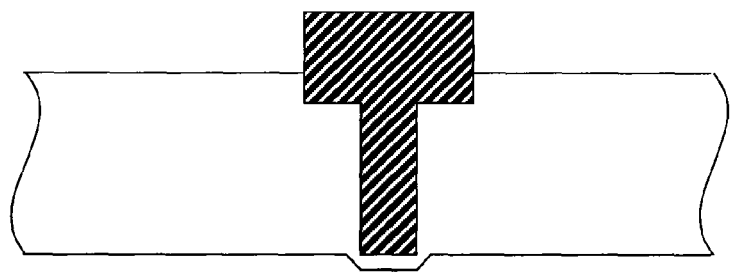
Figure 13C:
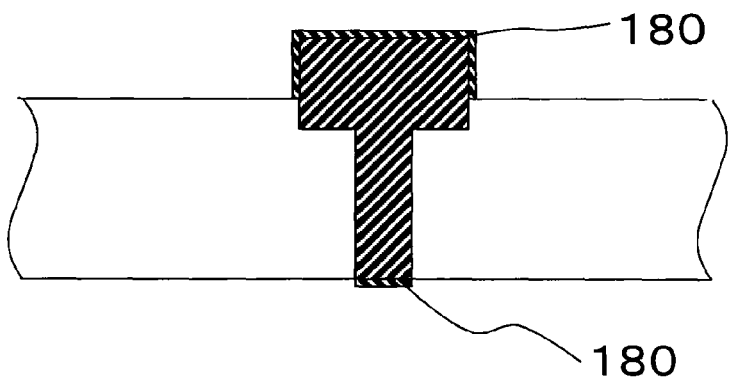

FIG. 11I shows a step of dividing the package into individual parts. Specifically, the method of dividing the resultant into individual devices can be changed depending on the material of the cap 50, but can be carried out by the use of dicing or laser cut. The cap bonding step shown in FIG. 11G can be performed after the electronic component connecting step shown in FIG. 11F and does not have to be performed in the order shown in FIGS. 11A to 11I.

The electronic device according to the invention can be applied to electronic apparatuses such as an oscillation apparatus or a timepiece using the electronic device according to the invention as an oscillator, a portable digital apparatus having the electronic device according to the invention as a counter, and a radio clock having the electronic device according to the invention in a radio receiver receiving time information or the like.

What is claimed is:

1. An electronic device comprising:
a base formed of glass;
a through-electrode that passes through the base;
a circuit pattern that is formed on an end face of the through-electrode facing a surface of the base and on the surface of the base;
an electrode pattern that is formed on the other end face of the through-electrode facing the opposite surface of the base and on the opposite surface of the base;
an internal wiring that is electrically connected to the through-electrode and that is formed on the circuit pattern;
a connection portion that is electrically connected to the internal wiring and that is formed on the internal wiring;
an electronic component that is electrically connected to the connection portion and that is disposed on the connection portion; and
an external electrode that is electrically connected to the through-electrode and that is formed on the electrode pattern.

2. The electronic device according to claim 1, wherein the circuit pattern is formed of the same material as the electrode pattern.

3. The electronic device according to claim 1, wherein the internal wiring is formed of the same material as the external electrode.

4. The electronic device according to claim 3, wherein the internal wiring and the external electrode are formed of a metal film including a diffusion barrier layer preventing diffusion of metal and a surface layer which is formed on the diffusion barrier layer and of which the outermost surface is formed of gold.

5. The electronic device according to claim 1, wherein each of the internal wiring and the external electrode is formed of a single layer.

6. The electronic device according to claim 1, wherein the circuit pattern and the electrode pattern have a concave portion formed in the surface thereof.

7. The electronic device according to claim 2, wherein the circuit pattern and the electrode pattern are formed of aluminum.

8. The electronic device according to claim 4, wherein the diffusion barrier layer is formed of nickel.

9. The electronic device according to claim 1, further comprising a cap that is bonded to the surface of the base and that forms a cavity section isolated from external air along with the base.

10. The electronic device according to claim 9, wherein the cap is formed of one of aluminum, glass, and silicon.

11. The electronic device according to claim 9, wherein the electronic component is a crystal oscillator chip.

12. An electronic apparatus comprising the electronic device according to claim 1.

13. An electronic device manufacturing method comprising:
a step of forming a through-hole in a base;
a through-electrode forming step of inserting and welding a through-electrode into the through-hole;
a step of polishing end faces of the through-electrode;
a circuit pattern forming step of forming a circuit pattern on the end face of the through-electrode facing a surface of the base and on the surface of the base;
an electrode pattern forming step of forming an electrode pattern on the end face of the through-electrode facing the opposite surface of the base and on the opposite surface of the base;
an internal wiring forming step of forming an internal wiring on the circuit pattern and electrically connecting the internal wiring to the through-electrode;
an external electrode forming step of forming an external electrode on the electrode pattern and electrically connecting the external electrode to the through-electrode; and
an electronic component connecting step of electrically connecting an electronic component to the internal wiring.

14. The electronic device manufacturing method according to claim 13, wherein the internal wiring forming step and the external electrode forming step are carried out as the same step using the same method.

15. The electronic device manufacturing method according to claim 13, wherein the circuit pattern forming step and the electrode pattern forming step are carried out as the same step using the same method.

16. An electronic device manufacturing method comprising:
a step of forming a through-hole in a base;
a through-electrode forming step of inserting and welding a through-electrode into the through-hole;
a step of polishing end faces of the through-electrode;

a circuit pattern forming step of forming a circuit pattern on the end face of the through-electrode facing a surface of the base and on the surface of the base;

an internal wiring forming step of forming an internal wiring on the circuit pattern and electrically connecting the internal wiring to the through-electrode;

an electronic component connecting step of electrically connecting an electronic component to the internal wiring;

an electrode pattern forming step of forming an electrode pattern on the end face of the through-electrode facing the opposite surface of the base and on the opposite surface of the base; and an external electrode forming step of forming an external electrode on the electrode pattern and electrically connecting the external electrode to the through-electrode.

17. The electronic device manufacturing method according to claim 13, wherein at least one of the internal wiring and the external electrode is formed by the use of an electroless plating method in the internal wiring forming step and the external electrode forming step.

18. The electronic device manufacturing method according to claim 13, further comprising a cap bonding step of bonding a cap to the surface of the base to form a cavity section isolated from external air between the base and the cap and providing the electronic component to the cavity section, after the electronic component connecting step.

19. The electronic device manufacturing method according to claim 13, further comprising a step of dividing a plurality of electronic devices into individual electronic devices after forming the plurality of electronic devices on the single base in a bundle.

* * * * *